United States Patent
Saiki et al.

(10) Patent No.: US 10,399,306 B2
(45) Date of Patent: Sep. 3, 2019

(54) PROTECTIVE FILM FORMING FILM, SHEET FOR FORMING PROTECTIVE FILM, AND INSPECTION METHOD

(71) Applicant: Lintec Corporation, Tokyo (JP)

(72) Inventors: Naoya Saiki, Koshigaya (JP); Daisuke Yamamoto, Warabi (JP); Hiroyuki Yoneyama, Nagareyama (JP); Ken Takano, Kitaadachi-gun (JP)

(73) Assignee: Lintec Corporation, Tokyo (JP)

( * ) Notice: Subject to any disclaimer, the term of this patent is extended or adjusted under 35 U.S.C. 154(b) by 279 days.

(21) Appl. No.: 14/908,524

(22) PCT Filed: Jan. 30, 2014

(86) PCT No.: PCT/JP2014/052111
§ 371 (c)(1),
(2) Date: Jan. 28, 2016

(87) PCT Pub. No.: WO2015/015817
PCT Pub. Date: Feb. 5, 2015

(65) Prior Publication Data
US 2016/0167345 A1     Jun. 16, 2016

(30) Foreign Application Priority Data
Jul. 31, 2013   (JP) ................. 2013-159997

(51) Int. Cl.
*B32B 27/06*     (2006.01)
*H01L 21/683*    (2006.01)
(Continued)

(52) U.S. Cl.
CPC ............... *B32B 27/06* (2013.01); *B32B 7/06* (2013.01); *B32B 7/12* (2013.01); *B32B 27/08* (2013.01);
(Continued)

(58) Field of Classification Search
CPC ... H01L 23/502; H01L 21/6836; H01L 22/12; G01N 21/9505; C09J 7/30; B32B 7/12;
(Continued)

(56) References Cited

U.S. PATENT DOCUMENTS 5,693,415 A      12/1997  Zait et al.
2001/0003374 A1*  6/2001  Bohmer ............... H01L 23/573
                                                          257/679

(Continued)

FOREIGN PATENT DOCUMENTS

JP     54-046055 A    4/1979
JP     02-191353 A    7/1990
(Continued)

OTHER PUBLICATIONS

Notice of Allowance for Japanese Application No. 2017-120672 dated Sep. 12, 2017.

(Continued)

*Primary Examiner* — Latanya N Crawford
(74) *Attorney, Agent, or Firm* — Christopher Casieri

(57) ABSTRACT

Provided is a sheet 2 for forming a protective film including a protective film-forming film 1 of which the light transmittance at a wavelength of 1600 nm is 25% or greater, and light transmittance at a wavelength of 550 nm is 20% or less, and a release sheet 21 which is laminated on one or both surfaces of the protective film-forming film 1. According to such a sheet 2 for forming a protective film, cracks existing in a workpiece or a manufactured product obtained by processing the workpiece can be inspected and a protective film in which grinding marks existing in the workpiece or the manufactured product are not visually recognized can be formed.

6 Claims, 1 Drawing Sheet

(51) Int. Cl.

| | | |
|---|---|---|
| *B32B 7/06* | (2019.01) | |
| *B32B 27/30* | (2006.01) | |
| *B32B 27/38* | (2006.01) | |
| *C09D 5/00* | (2006.01) | |
| *C09D 133/08* | (2006.01) | |
| *H01L 21/66* | (2006.01) | |
| *H01L 23/31* | (2006.01) | |
| *C09J 133/06* | (2006.01) | |
| *B32B 7/12* | (2006.01) | |
| *B32B 27/08* | (2006.01) | |
| *B32B 27/32* | (2006.01) | |
| *B32B 27/36* | (2006.01) | |
| *C09J 7/22* | (2018.01) | |
| *C09J 7/30* | (2018.01) | |
| *H01L 23/544* | (2006.01) | |

(52) U.S. Cl.
CPC ............ *B32B 27/308* (2013.01); *B32B 27/32* (2013.01); *B32B 27/36* (2013.01); *B32B 27/38* (2013.01); *C09D 5/00* (2013.01); *C09D 133/08* (2013.01); *C09J 7/22* (2018.01); *C09J 7/30* (2018.01); *C09J 133/06* (2013.01); *H01L 21/6836* (2013.01); *H01L 22/12* (2013.01); *H01L 23/3157* (2013.01); *B32B 2255/10* (2013.01); *B32B 2255/26* (2013.01); *B32B 2307/40* (2013.01); *B32B 2307/54* (2013.01); *B32B 2307/748* (2013.01); *B32B 2457/14* (2013.01); *B32B 2571/00* (2013.01); *C09J 2201/622* (2013.01); *C09J 2203/326* (2013.01); *H01L 23/544* (2013.01); *H01L 2221/68318* (2013.01); *H01L 2221/68336* (2013.01); *H01L 2221/68377* (2013.01); *H01L 2221/68381* (2013.01); *H01L 2223/54486* (2013.01); *H01L 2924/0002* (2013.01)

(58) Field of Classification Search
CPC ... B32B 7/06; B32B 2307/40; B32B 2457/14; B32B 27/06
See application file for complete search history.

(56) References Cited

U.S. PATENT DOCUMENTS

| | | | | |
|---|---|---|---|---|
| 2005/0233547 | A1* | 10/2005 | Noda | B32B 43/006 438/459 |
| 2012/0028380 | A1 | 2/2012 | Takamoto et al. | |
| 2013/0032946 | A1 | 2/2013 | West et al. | |

FOREIGN PATENT DOCUMENTS

| | | | |
|---|---|---|---|
| JP | 06-347417 | A | 12/1994 |
| JP | 09-036394 | A | 2/1997 |
| JP | 2000-286314 | A | 10/2000 |
| JP | 2000-314807 | A | 11/2000 |
| JP | 2004-142430 | A | 5/2004 |
| JP | 2005-101237 | A | 4/2005 |
| JP | 2005-191283 | A | 7/2005 |
| JP | 2008-045965 | A | 2/2008 |
| JP | 2010-034133 | A | 2/2010 |
| JP | 2010-122145 | A | 6/2010 |
| JP | 2010-225613 | A | 10/2010 |
| JP | 2010-225645 | A | 10/2010 |
| JP | 2011-151363 | A | 8/2011 |
| JP | 2011-228499 | A | 11/2011 |
| JP | 2012-015236 | A | 1/2012 |
| JP | 2012-019138 | A | 1/2012 |
| JP | 2012-028396 | A | 2/2012 |
| JP | 2012-033741 | A | 2/2012 |
| JP | 2012-156217 | A | 8/2012 |
| JP | 2012-156377 | A | 8/2012 |
| JP | 2012-201873 | A | 10/2012 |
| JP | 2012-207179 | A | 10/2012 |
| JP | 2012-235168 | A | 11/2012 |
| JP | 2013-120841 | A | 6/2013 |
| JP | 2013-135041 | A | 7/2013 |
| JP | 2013131594 | A | 7/2013 |
| JP | 2012-156377 | A | 8/2018 |
| WO | 2013/099869 | A1 | 7/2013 |

OTHER PUBLICATIONS

Sachihiro Ozaki, Satoshi Kawata, "Near-infrared spectroscopy", Spectroscopical Society of Japan, Measurement method series 32, 3rd Edition, pp. 216-219 (2005).
Measurement results of light transmittance of "Oil Green 502" manufactured by Orient Chemical Industries Co., Ltd.
Measurement results of light transmittance of "Oil Black BS" manufactured by Orient Chemical Industries Co., Ltd.
Notification (Information Statement) for JP Application No. 2013-159997 dated Feb. 28, 2017.
Notification (Information Statement) for JP Application No. 2013-15997 dated Feb. 28, 2017.
International Search Report for international application No. PCT/JP2014/052111.
Notice of Allowance for Japanese Application No. 2017-198432 dated Aug. 7, 2018.
Office Action for Japanese Application No. 2018-167270 dated Jun. 25, 2019.

* cited by examiner

PROTECTIVE FILM FORMING FILM, SHEET FOR FORMING PROTECTIVE FILM, AND INSPECTION METHOD

This application is a 371 of international application No. PCT/JP2014/052111, filed Jan. 30, 2014, which, in turn, claims priority of Japanese Patent Application No.: 2013-159997, filed on Jul. 31, 2013.

TECHNICAL FIELD

The present invention relates to a protective film-forming film and a (composite) sheet for forming a protective film which are capable of forming a protective film on a workpiece such as a semiconductor wafer or a manufactured product (for example, a semiconductor chip) obtained by processing the workpiece and an inspection method which performs inspection on a workpiece provided with a protective film or a manufactured product obtained using these.

BACKGROUND ART

In recent years, a semiconductor device has been manufactured by a mounting method referred to as a face-down method. In this method, when a semiconductor chip having a circuit surface on which an electrode such as a bump is formed is mounted, the circuit surface side of the semiconductor chip is bonded to a chip mounting portion such as a lead frame. Accordingly, the semiconductor device has a structure in which the rear surface side of the semiconductor chip on which a circuit is not formed is exposed.

For this reason, a protective film formed of a hard organic material is frequently formed on the rear surface side of the semiconductor chip for the purpose of protecting the semiconductor chip. The protective film is formed using, for example, a film for a semiconductor rear surface or a dicing tape-integrated wafer rear surface protective film disclosed in PTL 1 or 2.

In the film for a semiconductor rear surface in PTL 1, the light transmittance at a wavelength of 532 nm or 1064 nm is set to 20% or less. In this manner, it is possible to perform a printing process using irradiation with laser light and to prevent a semiconductor element from being adversely affected by the laser light. In addition, in a wafer rear surface protective film in PTL 2, the visible light transmittance is set to 20% or less. In this manner, influence on a semiconductor element due to transmission of light beams is reduced.

CITATION LIST

Patent Literature

[PTL 1] Japanese Unexamined Patent Application, First Publication No. 2012-28396
[PTL 2] Japanese Unexamined Patent Application, First Publication No. 2012-235168

SUMMARY OF INVENTION

Technical Problem

Meanwhile, cracks are occasionally generated due to stress generated during processing of the semiconductor chip or the like, obtained by dicing a semiconductor wafer. When a protective film having a light transmittance described above is formed, cracks or the like generated on the protective film side of the semiconductor chip cannot be detected by visual observation. The product yield is reduced by the semiconductor chip on which cracks or the like, which cannot be overlooked, are formed.

In addition, grinding marks resulting from a back-grinding process performed on the semiconductor wafer normally remain on the rear surface of the semiconductor chip. From a viewpoint of the appearance of the semiconductor chip, it is desirable that such grinding marks are not detected by visual observation and are concealed by the above-described protective film.

The present invention has been made in consideration of the above-described problems, and an object thereof is to provide a protective film-forming film and a (composite) sheet for forming a protective film which are capable of performing inspection of cracks or the like existing on a workpiece or a manufactured product obtained by processing the workpiece, and capable of forming a protective film in which grinding marks existing on the workpiece or the manufactured product cannot be detected by visual observation; and an inspection method which performs inspection on a workpiece provided with a protective film or manufactured product obtained using these.

Solution to Problem

In order to achieve the above-described purpose, a first invention provides a protective film-forming film in which the light transmittance at a wavelength of 1600 nm is 25% or greater, and the light transmittance at a wavelength of 550 nm is 20% or less (invention 1).

According to the invention (invention 1), it is possible to perform inspection on cracks or the like existing in a workpiece or a manufactured product obtained by processing the workpiece using infrared rays, and to form a protective film by which grinding marks existing on the workpiece or the manufactured product cannot be detected by visual observation.

In the invention (invention 1), it is preferable that the protective film-forming film is a single layer formed of an uncured curable adhesive (invention 2).

In the invention (invention 2), it is preferable that the curable adhesive contains a colorant and a filler having an average particle diameter of 0.01 μm to 3 μm (invention 3).

A second invention provides a sheet for forming a protective film including: the protective film-forming film (inventions 1 to 3); and a release sheet which is laminated on one or both surfaces of the protective film-forming film (invention 4).

A third invention provides a composite sheet for forming a protective film including: an adhesive sheet which is formed by laminating a pressure sensitive adhesive layer on one surface side of a base material; and a protective film-forming film which is laminated on the a pressure sensitive adhesive layer side of the adhesive sheet, in which the light transmittance at a wavelength of 1600 nm of the protective film-forming film is 25% or greater, and the light transmittance at a wavelength of 550 nm of the protective film-forming film is 20% or less (invention 5).

According to the inventions (inventions 4 and 5), it is possible to perform inspection on cracks or the like existing in a workpiece or a manufactured product obtained by processing the workpiece using infrared rays and to form a protective film in which grinding marks existing on the workpiece or the manufactured product cannot be detected by visual observation.

In the invention (invention 5), it is preferable that the protective film-forming film is a single layer formed of an uncured curable adhesive (invention 6).

In the invention (invention 6), it is preferable that the curable adhesive contains a colorant and a filler having an average particle diameter of 0.01 μm to 3 μm (invention 7).

A fourth invention provides an inspection method including: producing a workpiece provided with a protective film by forming a protective film on a workpiece using the protective film-forming film (inventions 1 to 3), the sheet for forming a protective film (invention 4), or the composite sheet for forming a protective film (inventions 5 to 7); and performing inspection on the workpiece provided with a protective film or a manufactured product obtained by processing the workpiece provided with a protective film through the protective film using infrared rays (invention 8).

In the invention (invention 8), it is preferable that the workpiece is a semiconductor wafer and the manufactured product is a semiconductor chip (invention 9).

A fifth invention provides a workpiece provided with a protective film which is determined as a non-defective product based on the inspection method (inventions 8 and 9) (invention 10).

A sixth invention provides a manufactured product which is determined as a non-defective product based on the inspection method (inventions 8 and 9) (invention 11).

Advantageous Effects of Invention

According to the protective film-forming film and the (composite) sheet for forming a protective film according to the present invention, it is possible to perform inspection on cracks or the like existing on a workpiece or a manufactured product obtained by processing the workpiece using infrared rays and to form a protective film by which grinding marks existing on the workpiece or the manufactured product cannot be detected by visual observation. Further, according to the inspection method according to the present invention, it is possible to perform inspection on cracks or the like existing in a workpiece or manufactured product using infrared rays.

DESCRIPTION OF EMBODIMENTS

Figure 1:
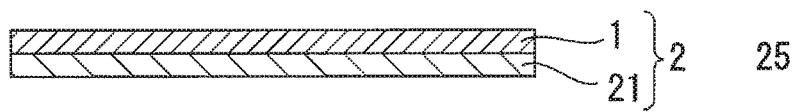
FIG. 1 is a sectional view illustrating a sheet for forming a protective film according to an embodiment of the present invention.

Hereinafter, embodiments of the present invention will be described.

[Protective Film-Forming Film]

A protective film-forming film according to the present embodiment is used for forming a protective film on a workpiece or a manufactured product obtained by processing the workpiece. The protective film is formed of a protective film-forming film, preferably, a cured protective film-forming film. A semiconductor wafer or the like is exemplified as a workpiece and a semiconductor chip or the like is exemplified as a manufactured product obtained by processing the workpiece, but the present invention is not limited thereto. Further, in a case where the workpiece is a semiconductor wafer, a protective film is formed on the rear surface side (side on which an electrode such as a bump is not formed) of the semiconductor wafer.

1. Physical Properties

In the protective film-forming film according to the present invention, the light transmittance at a wavelength of 1600 nm is 25% or greater and the light transmittance at a wavelength of 550 nm is 20% or less. In addition, the light transmittance in the present specification is set as a value measured without using an integrating sphere and a spectrophotometer is used a measurement instrument.

Cracks or the like are occasionally generated due to stress generated during processing in the semiconductor chip or the like obtained by dicing a semiconductor wafer. When the light transmittance at a wavelength of 1600 nm is 25% or greater as described above, the permeability of infrared rays becomes excellent and infrared inspection that acquires infrared rays from the protective film-forming film (or a protective film formed by the protective film-forming film) side can be performed. In this manner, cracks or the like in a manufactured product such as a semiconductor chip or the like can be detected through the protective film-forming film (protective film) and the product yield can be improved.

From a viewpoint of the permeability of infrared rays, the light transmittance of the protective film-forming film at a wavelength of 1600 nm is preferably 40% or greater, particularly preferably 45% or greater, and more particularly preferably 50% or greater. In addition, the upper limit of the light transmittance at a wavelength of 1600 nm is not particularly limited, but the upper limit thereof is naturally determined by setting the light transmittance at a wavelength of 550 nm to 20% or less. Moreover, at the time of using a manufactured product (semiconductor chip or the like) on which a protective film is formed, malfunction of the manufactured product which can be easily affected by infrared rays from the outside can be prevented by setting the light transmittance of the protective film-forming film at a wavelength of 1600 nm to 90% or less.

In addition, grinding marks caused by a back-grinding process normally performed on a semiconductor wafer remain on the rear surface of the semiconductor chip. When the light transmittance at a wavelength of 550 nm is 20% or less as described above, it becomes difficult for the protective film-forming film to transmit visible light beams. Therefore, the grinding marks are concealed by the protective film-forming film (protective film) and cannot be almost detected by visual observation. In this manner, the appearance of the manufactured product such as a semiconductor chip becomes excellent.

From a viewpoint of the grinding mark concealing properties, the light transmittance of the protective film-forming film at a wavelength of 550 nm is preferably 15% or less and particularly preferably 10% or less. Moreover, the lower limit of the light transmittance at a wavelength of 550 nm is not particularly limited, but the lower limit thereof is determined in a natural way by setting the light transmittance at a wavelength of 1600 nm to 25% or less.

Here, the protective film-forming film according to the present embodiment may be formed of a single layer or a plurality of layers, but it is preferable that the protective film-forming film is formed of a single layer in terms of ease of controlling the light transmittance and production cost. In a case where the protective film-forming film is formed of a plurality of layers, it is preferable to satisfy the above-described light transmittance as the entirety of the plurality of layers in terms of ease of controlling light transmittance.

2. Material

It is preferable that the protective film-forming film is formed of an uncured curable adhesive. In this case, a protective film can be firmly adhered to a workpiece and the protective film having durability can be formed on a chip or the like by overlapping the workpiece such as a semiconductor wafer with the protective film-forming film and then curing the protective film-forming film.

Further, in a case where the protective film-forming film is formed of an uncured curable adhesive, the light transmittance of the protective film-forming film is not changed before or after curing. Accordingly, when the light transmittance of the protective film-forming film at a wavelength of 1600 nm before curing is 25% or greater and the light transmittance thereof at a wavelength of 550 nm is 20% or less, the light transmittance of the protective film-forming film (protective film) at a wavelength of 1600 nm after curing is also 25% or greater and the light transmittance thereof at a wavelength of 550 nm is also 20% or less.

It is preferable that the protective film-forming film has tackiness at room temperature or exhibits tackiness by being heated. In this manner, when a workpiece such as a semiconductor wafer overlaps the protective film-forming film as described above, the protective film-forming film and the workpiece can be adhered to each other. Accordingly, positioning can be reliably performed before the protective film-forming film is cured.

It is preferable the curable adhesive constituting the protective film-forming film having the above-described characteristics contains a curable component and a binder polymer component. A thermoset component, an energy ray curable component, or a mixture of these can be used as the curable component, but a thermoset component is particularly preferable. Since the protective film-forming film becomes unsuitable for UV curing when the light transmittance is in the above-described range, it is desirable that the protective film-forming film is a thermoset.

Examples of the thermoset component include an epoxy resin, a phenolic resin, a melamine resin, a urea resin, a polyester resin, a urethane resin, an acrylic resin, a polyimide resin, a benzoxazine resin, and a mixture of these. Among these, an epoxy resin, a phenolic resin, or a mixture of these is preferable.

An epoxy resin has properties of being three-dimensionally reticulated and forming a strong coating film when is heated. As such an epoxy resin, known various epoxy resins of the related art can be used, but, normally, an epoxy resin having a molecular weight of approximately 300 to 2000 is preferable and an epoxy resin having a molecular weight of 300 to 500 is particularly preferable. Further, it is preferable that a liquid epoxy resin in a normal state in which the molecular weight is in a range of 330 to 400 and a solid epoxy resin at room temperature in which the molecular weight is in a range of 400 to 2500 and particularly in a range of 500 to 2000 are blended with each other and then used. Moreover, it is preferable that the epoxy equivalent of the epoxy resin is in a range of 50 g/eq to 5000 g/eq.

Specific examples of such an epoxy resin include glycidyl ether of phenols such as bisphenol A, bisphenol F, resorcinol, phenyl novolac, or cresol novolac; glycidyl ether of alcohols such as butanediol, polyethylene glycol, or polypropylene glycol; glycidyl ether of carboxylic acid such as phthalic acid, isophthalic acid, or tetrahydrophthalic acid; a glycidyl type or alkyl glycidyl type epoxy resin in which active hydrogen bonded to a nitrogen atom such as aniline isocyanurate is substituted with a glycidyl group; and so-called alicyclic epoxide in which epoxy is introduced by, for example, oxidizing a carbon-carbon double bond in a molecule such as vinyl cyclohexane diepoxide, 3,4-epoxycyclohexylmethyl-3,4-dicyclohexanecarboxylate, or 2-(3,4-epoxy)cyclohexyl-5,5-spiro(3,4-epoxy)cyclohexane-m-dioxane. In addition, it is possible to use an epoxy resin having a biphenyl skeleton, a dicyclohexanediene skeleton, or a naphthalene skeleton.

Among these, a bisphenol-based glycidyl type epoxy resin, an o-cresol novolac type epoxy resin, and a phenol novolac type epoxy resin is preferably used. These epoxy resins may be used alone or in combination of two or more kinds thereof.

In a case of using an epoxy resin, it is preferable to use a thermally active latent epoxy resin curing agent as an auxiliary agent. The thermally active latent epoxy resin curing agent is a curing agent which does not react with an epoxy resin at room temperature, and instead reacts with an epoxy resin by being activated when heated at a certain temperature or higher. Examples of the method of activating of a thermally active latent epoxy resin curing agent include a method of generating active species (an anion and a cation) through a chemical reaction when heated; a method of stably dispersing a curing agent in an epoxy resin at around room temperature, allowing the curing agent to be compatible with and dissolved in the epoxy resin at a high temperature, and starting a curing reaction; a method of performing elution at a high temperature using a molecular sieve enclosed type curing agent and starting a curing reaction; and a method of using a microcapsule.

Specific examples of the thermally active latent epoxy resin curing agent include a high-melting-point active hydrogen compound such as various onium salts, a dibasic acid dihydrazide compound, dicyandiamide, an amine adduct curing agent, or an imidazole compound. These thermally active latent epoxy resin curing agents can be used alone or in combination of two or more kinds thereof. The content of the above-described thermally active latent epoxy resin curing agent is preferably in a range of 0.1 parts by weight to 20 parts by weight, particularly preferably in a range of 0.2 parts by weight to 10 parts by weight, and more particularly preferably in a range of 0.3 parts by weight to 5 parts by weight with respect to 100 parts by weight of an epoxy resin.

As a phenolic resin, a condensate of phenols such as alkyl phenol, polyhydric phenol, and naphthol and aldehydes is used without any particular limitation. Specific examples thereof include a phenol novolac resin, an o-cresol novolac resin, a p-cresol novolac resin, a t-butyl phenol novolac resin, a dicyclopentadiene cresol resin, a polyparavinyl phenol resin, a bisphenol A type novolac resin, and a modified product of these.

A phenolic hydroxyl group contained in the phenolic resin can form a cured product having high impact resistance by easily performing an addition reaction with an epoxy group of the epoxy resin when heated. For this reason, an epoxy resin and a phenolic resin may be used together.

A binder polymer component provides moderate tackiness for the protective film-forming film and improves operability of a composite sheet 3 for forming a protective film. The weight average molecular weight of the binder polymer is normally in a range of 50000 to 2000000, preferably in a range of 100000 to 1500000, and particularly preferably in a range of 200000 to 1000000. Film formation of a protective film-forming film becomes insufficient when the molecular weight thereof is excessively small and compatibility with other components becomes poor, and additionally, uniform film formation is obstructed when the molecular weight thereof is excessively large. Examples of such a binder polymer include an acrylic polymer, a polyester resin, a phenoxy resin, a urethane resin, a silicone resin, and a rubber polymer. Among these, an acrylic polymer is preferably used.

As the acrylic polymer, a (meth)acrylic acid ester copolymer formed of constituent units derived from a (meth)acrylic acid ester monomer and a (meth)acrylic acid derivative is exemplified. Here, preferred examples of the (meth)acrylic acid ester monomer include (meth)acrylic acid alkyl ester having 1 to 18 carbon atoms of an alkyl group such as methyl (meth)acrylate, ethyl (meth)acrylate, propyl (meth)acrylate, or butyl (meth)acrylate. Further, examples of the (meth)acrylic acid derivative include (meth)acrylic acid, glycidyl (meth)acrylate, and hydroxyethyl (meth)acrylate.

When a glycidyl group is introduced to an acrylic polymer using glycidyl methacrylate or the like from the examples described above as a constituent unit, compatibility with an epoxy resin as the above-described thermally curable component is improved, the glass transition temperature (Tg) after the protective film-forming film is cured is increased, and heat resistance is improved. When a hydroxyl group is introduced to an acrylic polymer using hydroxyethyl acrylate or the like as a constituent unit from the examples described above, adhesiveness or adhesion properties to a workpiece can be controlled.

The weight average molecular weight of the polymer in a case of using an acrylic polymer as a binder polymer is preferably 100000 or greater and particularly preferably 150000 to 1000000. The glass transition temperature of the acrylic polymer is normally 20° C. or lower and preferably in a range of approximately −70° C. to 0° C. The acrylic polymer has tackiness at room temperature (23° C.).

The mixing ratio of the thermoset component to the binder polymer component is preferably in a range of 50 parts by weight to 1500 parts by weight, particularly preferably in a range of 70 parts by weight to 1000 parts by weight, and more particularly preferably in a range of 80 parts by weight to 800 parts by weight with respect to 100 parts by weight of the binder polymer component. When the thermoset component is mixed with the binder polymer component at such a ratio, moderate tackiness is shown before curing and an adhering operation can be stably performed, thereby obtaining a protective film with excellent film strength after curing.

It is preferable that the protective film-forming film contains a colorant and/or a filler, and particularly preferable that the protective film-forming film contains both of a colorant and a filler. In this manner, the light transmittance at a wavelength of 1600 nm or a wavelength of 550 nm can be controlled to be in the above-described range. In addition, when the protective film-forming film contains a filler, the hardness of the protective film after curing can be maintained to be high and moisture resistance can be improved. Moreover, the thermal expansion coefficient of the protective film after curing can be set to be closer to the thermal expansion coefficient of a semiconductor wafer, and thus warpage of the semiconductor wafer during the process can be reduced.

As the colorant, a known colorant such as an inorganic pigment, an organic pigment, or an organic dye can be used, and an inorganic pigment is preferably used from a viewpoint of controlling light transmittance.

Examples of the inorganic pigment include carbon black, a cobalt-based pigment, an iron-based pigment, a chromium-based pigment, a titanium-based pigment, a vanadium-based pigment, a zirconium-based pigment, a molybdenum-based pigment, a ruthenium-based pigment, a platinum-based pigment, an indium tin oxide (ITO)-based pigment, and an antimony tin oxide (ATO)-based pigment.

Examples of the organic pigment and the organic dye include an aluminum-based pigment, a cyanine-based pigment, a merocyanine-based pigment, a croconium-based pigment, a squarylium-based pigment, an azulenium-based pigment, a polymethine-based pigment, a naphthoquinone-based pigment, a pyrylium-based pigment, a phthalocyanine-based pigment, a naphthalocyanine-based pigment, a naphtholactam-based pigment, an azo-based pigment, a condensed azo-based pigment, an indigo-based pigment, a perinone-based pigment, a perylene-based pigment, a dioxazine-based pigment, a quinacridone-based pigment, an isoindolinone-based pigment, a qinophthalone-based pigment, a pyrrole-based pigment, a thioindigo-based pigment, a metal complex-based pigment (metal complex dye), a dithiol metal complex-based pigment, an indole phenol-based pigment, a triallylmethane-based pigment, an anthraquinone-based pigment, a dioxazine-based pigment, a naphthol-based pigment, an azomethine-based pigment, a benzimidazolone-based pigment, a pyranthrone-based pigment, and a threne-based pigment. These pigments or dyes can be used by being appropriately mixed with each other for the purpose of adjustment to a target light transmittance.

Among these, carbon black is particularly preferably used. According to the carbon black, light transmittance at a wavelength of 1600 nm or a wavelength of 550 nm is easily controlled to be in the above-described range.

The amount of the colorant (particularly carbon black) to be mixed in the protective film-forming film varies depending on the thickness of the protective film-forming film. For example, in a case where the thickness of the protective film-forming film is 25 μm, the amount thereof is preferably in a range of 0.05% by mass to 1% by mass, particularly preferably in a range of 0.075% by mass to 0.75% by mass, and more particularly preferably in a range of 0.1% by mass to 0.5% by mass. When the amount of the colorant to be mixed is 0.05% by mass or greater, the light transmittance at a wavelength of 550 nm is easily controlled to be 20% or less such that grinding marks in a semiconductor chip or the like cannot be seen by visual observation. Meanwhile, when the amount of the colorant to be mixed exceeds 1% by mass, infrared rays cannot be transmitted through the protective film-forming film (protective film) and infrared inspection cannot be performed. In addition, when the thickness of the protective film-forming film becomes small, the light transmittance is likely to be greater. When the thickness of the protective film-forming film becomes greater, since the light transmittance is likely to be smaller, it is desirable that the amount of the colorant to be mixed is appropriately adjusted according to the thickness of the protective film-forming film. Specifically, it is desirable that the thickness of the protective film-forming film and the amount of the colorant to be mixed are adjusted to have an inverse proportional relationship.

The average particle diameter of the colorant (particularly carbon black) is preferably in a range of 1 nm to 500 nm, particularly preferably in a range of 3 nm to 100 nm, and more particularly preferably in a range of 5 nm to 50 nm. When the average particle diameter of the colorant is in the above-described range, the light transmittance at a wavelength of 550 nm and the light transmittance at a wavelength of 1600 nm are easily controlled to be in the above-described range. Further, the average particle diameter of the colorant in the present specification is set to be a value measured using a particle size distribution measuring device (Nanotrac Wave-UT151, manufactured by NIKKISO CO., LTD.) according to a dynamic light scattering method.

Examples of the filler include silica such as crystalline silica, fused silica, or synthetic silica; and an inorganic filler such as alumina or glass balloon. Among these, silica is preferable, synthetic silica is more preferable, and particularly synthetic silica in which radiation sources of α-rays which become a factor of malfunction of a semiconductor device are removed as much as possible is optimal. Examples of the shape of the filler include a spherical shape, a needle-like shape, and an amorphous shape. Among these, a spherical shape is preferable, and a true spherical shape is particularly preferable. When the filler particles have a spherical or true spherical shape, the diffused reflection of light beams is unlikely to occur, and the above-described infrared inspection is favorably performed.

Further, as a filler to be added to the protective film-forming film, a functional filler may be mixed in addition to the above-described inorganic filler. Examples of the functional filler include a conductive filler in which gold, silver, copper, nickel, aluminum, stainless steel, carbon, ceramic, nickel, or aluminum is covered with silver, used for providing conductivity after die bonding; and a thermal conductive filler of a metal material such as gold, silver, copper, nickel, aluminum, stainless steel, silicon, or germanium or an alloy of these, used for providing thermal conductivity.

The average particle diameter of a filler (particularly a silica filler) is preferably in a range of 0.01 μm to 10 μm, more preferably in a range of 0.01 μm to 3 μm, particularly preferably in a range of 0.03 μm to 2 μm, and still more preferably in a range of 0.05 μm to 1 μm. When the average particle diameter of the filler is 0.01 μm or greater, the light transmittance at a wavelength of 550 nm is easily controlled to be 20% or less such that grinding marks in the semiconductor chip or the like cannot be detected by visual observation. Meanwhile, when the average particle diameter of the filler exceeds 10 μm, the surface state of the protective film-forming film may become worse. In addition, when the average particle diameter of the filler exceeds 3 μm, infrared inspection is occasionally difficult to perform due to the diffused reflection of infrared rays. Further, the average particle diameter of less than 1 μm of the filler in the present specification is set to be a value measured using a particle size distribution measuring device (Nanotrac Wave-UT151, manufactured by NIKKISO CO LTD.) according to a dynamic light scattering method. Moreover, the average particle diameter of 1 μm or greater of the filler is set to be a value measured using a particle size distribution measuring device (Microtrac MT3000II, manufactured by NIKKISO CO., LTD.) according to a laser diffraction scattering method.

The amount of the filler (particularly a silica filler) to be mixed in the protective film-forming film is preferably in a range of 10% by mass to 80% by mass, particularly preferably in a range of 20% by mass to 70% by mass, and more preferably in a range of 30% by mass to 65% by mass. When the amount of the filler to be mixed is 10% by mass or greater, the light transmittance at a wavelength of 550 nm is easily controlled to be 20% or less such that grinding marks in the semiconductor chip or the like cannot be detected by visual observation. Meanwhile, when the amount of the filler to be mixed exceeds 80% by mass, infrared rays cannot be transmitted through the protective film-forming film (protective film) and infrared inspection cannot be performed.

The protective film-forming film may contain a coupling agent. When the protective film-forming film contains a coupling agent, the adhesiveness and adherence between the protective film and the workpiece can be improved and the moisture resistance (moist-heat resistance) can be improved without damaging the heat resistance of the protective film after the protective film-forming film is cured. As the coupling agent, a silane coupling agent is preferable because of versatility thereof and cost benefits.

Examples of the silane coupling agent include γ-glycidoxypropyltrimethoxysilane, γ-glycidoxypropylmethyldiethoxysilane, β-(3,4-epoxycyclohexyl)ethyltrimethoxysilane, γ-(methacryloxypropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidopropyltrimethoxysilane, γ-mercaptopropyltrimethoxysilane, γ-mercaptopropylmethyldimethoxysilane, bis(3-triethoxysilylpropyl)tetrasulfane, methyl trimethoxy silane, methyl triethoxy silane, vinyl trimethoxy silane, vinyl triacethoxy silane, and imidazole silane. These may be used alone or in combination of two or more kinds thereof.

For the purpose of adjusting cohesive force before curing, the protective film-forming film may contain a crosslinking agent such as an organic polyvalent isocyanate compound, an organic polyvalent imine compound, or an organic metal chelate compound. In addition, for the purpose of suppressing static electricity and improving reliability of a chip, the protective film-forming film may contain an antistatic agent. Moreover, for the purpose of increasing flame retardancy of the protective film and improving reliability as a package, the protective film-forming film may contain a flame retardant such as a phosphoric acid compound, a bromine compound, or a phosphorus compound.

The thickness of the protective film-forming film is preferably in a range of 3 μm to 300 μm, particularly preferably in a range of 5 μm to 200 μm, and more particularly preferably in a range of 7 μm to 100 μm in order to effectively exhibit functions as a protective film.

[Sheet for Forming Protective Film]

FIG. 1 is a sectional view illustrating a sheet for forming a protective film according to an embodiment of the present invention. As illustrated in FIG. 1, a sheet 2 for forming a protective film according to the present embodiment includes a protective film-forming film 1 and a release sheet 21 laminated on one surface (surface on the lower side of FIG. 1) of the protective film-forming film 1. However, the release sheet 21 is released when the sheet 2 for forming a protective film is used.

The release sheet 21 is used to protect the protective film-forming film 1 during the time when the sheet 2 for forming a protective film is to be used and may not necessarily be present. The configuration of the release sheet 21 is optional, and a plastic film in which the film itself has release properties with respect to the protective film-forming film 1 and a film in which a plastic film is subjected to a release treatment using a release agent or the like are exemplified. Specific examples of the plastic film include a polyester film such as polyethylene terephthalate, polybutylene terephthalate, or polyethylene naphthalate; and a polyolefin film such as polypropylene or polyethylene. As the release agent, a silicone-based agent, a fluorine-based agent, a long chain alkyl-based agent, or the like can be used. Among these, a silicone-based agent in which stabilized performance can be obtained at a low coast is preferable. The thickness of the release sheet 21 is not particularly limited, but normally in a range of approximately 20 µm to 250 µm.

The above-described release sheet 21 may be laminated on another surface (surface on the upper side of FIG. 1) of the protective film-forming film 1. In this case, it is preferable that a heavy release type release sheet is obtained by increasing the release force of one release sheet 21 and a light release type release sheet is obtained by decreasing the release force of another release sheet 21.

In order to produce the sheet 2 for forming a protective film according to the present embodiment, the protective film-forming film 1 is formed on the release surface (surface having release properties: normally a surface subjected to a release treatment, but not limited thereto) of the release sheet 21. Specifically, a curable adhesive that constitutes the protective film-forming film 1 and a coating agent for a protective film-forming film that further contains a solvent, if desired, are prepared and the release surface of the release sheet 21 is coated with the curable adhesive and the coating agent using a coating machine such as a roll coater, a knife coater, a roll knife coater, an air knife coater, a die coater, a bar coater, a gravure coater, or a curtain coater and then dried, thereby forming the protective film-forming film 1.

A method of producing a chip provided with a protective film from a semiconductor wafer serving as a workpiece using the sheet 2 for forming a protective film according to the present embodiment will be described below. First, the protective film-forming film 1 of the sheet 2 for forming a protective film is adhered to the rear surface of the semiconductor wafer of which the surface is formed with a circuit, and which is subjected to a back-grinding process. At this time, tackiness may be allowed to be exhibited by heating the protective film-forming film 1, if desired.

Next, the release sheet 21 is released from the protective film-forming film 1. Next, a protective film is formed by curing the protective film-forming film 1, thereby obtaining a semiconductor wafer provided with a protective film. In a case where the protective film-forming film 1 is a thermoset adhesive, the protective film-forming film 1 may be heated at a predetermined temperature for an appropriate amount of time. In addition, the protective film-forming film 1 may be cured after a dicing process is performed.

When the semiconductor wafer provided with a protective film is obtained in this manner, the protective film is irradiated with laser light, if desired, and laser printing is performed. Further, the laser printing may be performed before the protective film-forming film 1 is cured.

Next, a chip having a protective film (chip provided with a protective film) is obtained by dicing the semiconductor wafer provided with a protective film using a desired dicing sheet according to a conventional method. Thereafter, the dicing sheet is expanded in a plane direction, if desired, and a chip provided with a protected film is picked up from the dicing sheet.

The appearance of the chip provided with a protective film obtained in the above-described manner is excellent because grinding marks caused by the back-grinding process are concealed by the protective film and cannot be detected by visual observation. In addition, since infrared inspection can be performed on the chip provided with a protective film and the semiconductor wafer provided with a protective film through the protective film, cracks or the like can be detected through the infrared inspection and the product yield can be improved.

Moreover, the infrared inspection is inspection performed using infrared rays and can be performed by acquiring infrared rays from a workpiece provided with a protective film such as a semiconductor wafer provided with a protective film or a manufactured product such as a chip provided with a protective film through the protective film. The wavelength of the infrared rays to be acquired is normally in a range of 800 nm to 2800 nm and preferably in a range of 1100 nm to 2100 nm. As a device for infrared inspection, a known device, for example, a device which includes an infrared camera or an infrared microscope can be used.

[Composite Sheet for Forming Protective Film]

Figure 2:
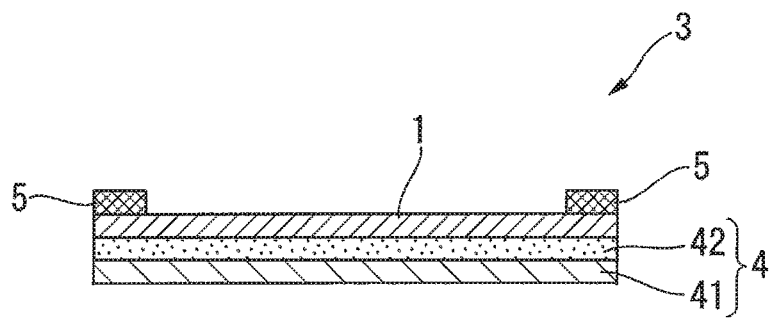
FIG. 2 is a sectional view illustrating a composite sheet for forming a protective film according to an embodiment of the present invention.

FIG. 2 is a sectional view of a composite sheet for forming a protective film according to an embodiment of the present invention. As illustrated in FIG. 2, the composite sheet 3 for forming a protective film according to the present embodiment includes an adhesive sheet 4 formed by laminating a pressure sensitive adhesive 42 on one surface of a base material 41; the protective film-forming film 1 laminated on the pressure sensitive adhesive layer 42 side of the adhesive sheet 4; and a pressure sensitive adhesive layer 5 for a jig laminated on a peripheral edge on the opposite side of the adhesive sheet 4 in the protective film-forming film 1. The pressure sensitive adhesive layer 5 for a jig is a layer used for bonding the composite sheet 3 for forming a protective film to a jig such as a ring frame or the like.

The composite sheet 3 for forming a protective film according to the embodiment is used for being adhered to a workpiece and holding the workpiece when the workpiece is processed and for forming a protective film on the workpiece or a manufactured product obtained by processing the workpiece. The protective film is configured of the protective film-forming film 1, or preferably the cured protective film-forming film 1.

The composite sheet 3 for forming a protective film according to the embodiment is used for holding a semiconductor wafer at the time of performing a process of dicing the semiconductor wafer as a workpiece and for forming a protective film on a semiconductor chip obtained by dicing, but the use thereof is not limited thereto. The adhesive sheet 4 of the composite sheet 3 for forming a protective film in this case is normally referred to as a dicing sheet.

1. Adhesive Sheet

The adhesive sheet 4 of the composite sheet 3 for forming a protective film according to the present embodiment includes the base material 41 and the pressure sensitive adhesive layer 42 laminated on one surface of the base material 41.

1-1. Base Material

The constituent material of the base material 41 of the adhesive sheet 4 is not particularly limited as long as the material is suitable for processing of a workpiece, for example, dicing or expanding the semiconductor wafer. The base material 41 of the adhesive sheet 4 is formed of a film (hereinafter, referred to as a "resin film") normally using a resin-based material as a main material.

Specific examples of the resin film include a polyethylene film such as a low-density polyethylene (LDPE) film, a linear low-density polyethylene (LLDPE) film, or a high-density polyethylene (HDPE) film; a polyolefin-based film such as a polypropylene film, a polybutene film, a polybutadiene film, a polymethyl pentene film, an ethylene-norbornene copolymer film, or a norbornene resin film; an ethylene-based copolymer film such as an ethylene-vinyl acetate copolymer film, an ethylene-(meth)acrylic acid copolymer film, or an ethylene-(meth)acrylic acid ester copolymer film; a vinyl polychloride-based film such as a vinyl polychloride film or a vinyl chloride copolymer film; a polyester-based film such as a polyethylene terephthalate film or a polybutylene terephthalate film; a polyurethane film; a polyimide film; a polystyrene film; a polycarbonate film; and a fluorine resin film. Moreover, cross-linked films of these or modified films such as ionomer films are also used. The above-described base material 41 may be a film formed of one kind of these, or a laminated film obtained by combining two or more kinds thereof. Further, "(meth) acrylic acid" in the present specification indicates both of acrylic acid and methacrylic acid. The same applies to other similar terminology.

Among these, from viewpoints of environmental safety and manufacturing costs, a polyolefin-based film is preferable and a polypropylene film having excellent heat resistance is preferable. When the polypropylene film is used, it is possible to provide heat resistance for the base material 41 without damaging expanding suitability of the adhesive sheet 4 or pickup suitability of a chip. When the base material 41 has such heat resistance, it is possible to prevent the adhesive sheet 4 from being loosened in a case where the protective film-forming film 1 is thermally cured in a state in which the composite sheet 3 for forming a protective film is adhered to a workpiece.

For the purpose of improving adhesiveness of the resin film to the pressure sensitive adhesive layer 42 to be laminated on the surface of the resin film, one or both surfaces of the resin film can be subjected to a surface treatment according to an oxidation method or a roughening method or a primer treatment, if desired. Examples of the oxidation method include a corona discharge treatment, a plasma discharge treatment, a chromium oxidation treatment (wet), a flame treatment, a hot air treatment, ozone, and an ultraviolet irradiation treatment, and examples of the roughening method include a sand blasting method and a thermal spray treatment method.

The resin film of the base material 41 may contain various additives such as a colorant, a flame retardant, a plasticizer, an antistatic agent, a lubricant, and a filler.

The thickness of the base material 41 is not particularly limited as long as the base material can properly function in each process of using the composite sheet 3 for forming a protective film. The thickness thereof is preferably in a range of 20 μm to 450 μm, more preferably in a range of 25 μm to 400 μm and particularly preferably in a range of 50 μm to 350 μm.

The breaking elongation of the base material 41 of the adhesive sheet 4 in the present embodiment is preferably 100% or greater and particularly preferably in a range of 200% to 1000% as a value measured under the conditions of a temperature of 23° C. and a relative humidity of 50%. Here, the breaking elongation is an elongation rate of a length of a test piece to an original length thereof at the time of test piece fracture during a tensile test carried out in conformity with JIS K7161:1994 (ISO 527-1 1993). The base material 41 having a breaking elongation of 100% or greater is unlikely to be broken during an expanding process and can easily separate a chip formed by cutting a workpiece.

Moreover, the tensile stress at the time of 25% strain of the base material 41 of the adhesive sheet 4 in the present embodiment is preferably in a range of 5 N/10 mm to 15 N/10 mm and the maximum tensile stress thereof is preferably in a range of 15 MPa to 50 MPa. Here, the tensile stress at the time of 25% strain and the maximum tensile stress are measured by a test carried out in conformity with JIS K7161:1994. When the tensile stress at the time of 25% strain is 5 N/10 mm or greater and the maximum tensile stress is 15 MPa or greater, it is possible to prevent the base material 2 from being loosened and to prevent transport errors from being generated while a workpiece is adhered to a dicing sheet 1, and then the workpiece is fixed to a frame such as a ring frame. Meanwhile, when the tensile stress at the time of 25% strain is 15 N/10 mm or less and the maximum tensile stress is 50 MPa or less, release of the dicing sheet 1 itself from the ring frame is suppressed at the time of expanding process. Further, the breaking elongation, the tensile stress at the time of 25% strain, and the maximum tensile stress indicate values measured in the longitudinal direction of original fabric in the base material 41.

1-2. Pressure Sensitive Adhesive Layer

The pressure sensitive adhesive layer 42 included in the adhesive sheet 4 of the composite sheet 3 for forming the protective film according to the present embodiment may be formed of a non-energy-ray curable pressure sensitive adhesive or an energy-ray curable pressure sensitive adhesive. As the non-energy-ray curable pressure sensitive adhesive, an adhesive having desired adhesive force and removability is preferable, and preferred examples thereof include an acrylic pressure sensitive adhesive, a rubber pressure sensitive adhesive, a silicone pressure sensitive adhesive, a urethane pressure sensitive adhesive, a polyester pressure sensitive adhesive, and a polyvinyl ether pressure sensitive adhesive. Among these, an acrylic pressure sensitive adhesive which has high adhesiveness to the protective film-forming film 1 and is capable of effectively suppressing separation of a workpiece or a manufactured product during the dicing process or the like is preferable.

Meanwhile, since the adhesive force of the energy-ray curable pressure sensitive adhesive is decreased due to irradiation with energy rays, the adhesive sheet 4 can be easily separated from a workpiece or a manufactured product by performing irradiation with energy rays when the adhesive sheet 4 is intended to be separated from a workpiece or a manufactured product.

In a case where the pressure sensitive adhesive layer 42 is formed of an energy-ray curable pressure sensitive adhesive, it is preferable that the pressure sensitive adhesive layer 42 in the composite sheet 3 for forming a protective film is cured. Since a material obtained by curing the energy-ray curable pressure sensitive adhesive normally has a high elastic modulus and the surface thereof has high smoothness, when the protective film-forming film 3 in contact with a cured portion formed of such a material is cured to form a protective film, the smoothness (gloss) of the surface in contact with the cured portion of the protective film becomes higher, and the appearance as a protective film of a chip becomes excellent. Moreover, when laser printing is performed on the protective film with high surface smoothness, the visibility of the printing is improved.

The energy-ray curable pressure sensitive adhesive constituting the pressure sensitive adhesive layer 42 may include a polymer having energy-ray curing properties as a main component, or may include a mixture of a monomer which does not have energy-ray curing properties, an energy-ray curable polyfunctional monomer and/or an oligomer as a main component.

The case where the energy-ray curable pressure sensitive adhesive includes a polymer having energy ray curing properties as a main component will be described below.

It is preferable that the polymer having energy ray curing properties is a (meth)acrylic acid ester (co)polymer (A) (hereinafter, also referred to as an "energy-ray curable polymer (A)") to which a functional group (energy ray curable group) having energy ray curing properties on the side chain thereof is introduced. It is preferable that the energy-ray curable polymer (A) is obtained by reacting a (meth)acrylic copolymer (a1) having a functional group-containing monomer unit with an unsaturated group-containing compound (a2) having a substituent bonded to the functional group thereof.

The acrylic copolymer (a1) is formed of a constituent unit derived from a functional group-containing monomer and a constituent unit derived from a (meth)acrylic acid ester monomer or a derivative thereof.

It is preferable that the functional group-containing monomer as a constituent unit of the acrylic copolymer (a1) is a monomer including a functional group such as a polymerizable double bond, a hydroxyl group, an amino group, a substituted amino group, or an epoxy group in a molecule.

More specific examples of the functional group-containing monomer include 2-hydroxyethyl(meth)acrylate, 2-hydroxypropyl(meth)acrylate, 3-hydroxypropyl(meth)acrylate, and 4-hydroxybutyl(methy)acrylate, and these can be used alone or in combination of two or more kinds thereof.

As the (meth)acrylic acid ester monomer constituting the acrylic copolymer (a1), alkyl (meth)acrylate having 1 to 20 carbon atoms of an alkyl group, cycloalkyl (meth)acrylate, or benzyl (meth)acrylate is used. Among these, alkyl (meth)acrylate having 1 to 18 carbon atoms of an alkyl group such as methyl (meth)acrylate, ethyl (meth)acrylate, propyl (meth)acrylate, n-butyl (meth)acrylate, or 2-ethylhexyl (meth)acrylate is particularly preferably used.

The acrylic copolymer (a1) contains normally 3% by mass to 100% by mass of a constituent unit derived from the functional group-containing monomer and preferably in a range of 5% by mass to 40% by mass thereof. Further, the acrylic copolymer (a1) contains normally 0% by mass to 97% by mass of a constituent unit derived from a (meth)acrylic acid ester monomer or a derivative thereof and preferably in a range of 60% by mass to 95% by mass thereof.

The acrylic copolymer (a1) is obtained by copolymerizing the above-described functional group-containing monomer, the (meth)acrylic acid ester monomer, and the derivative thereof according to a conventional method, but dimethyl acrylamide, vinyl formate, vinyl acetate, and styrene may be copolymerized other than these monomers.

An energy-ray curable polymer (A) is obtained by reacting the acrylic copolymer (a1) having the above-described functional group-containing monomer unit with the unsaturated group-containing compound (a2) having a substituent bonded to the functional group thereof.

The substituent included in the unsaturated group-containing compound (a2) can be appropriately selected according to the kind of the functional group of the functional group-containing monomer unit included in the acrylic copolymer (a1). For example, in a case where the functional group is a hydroxyl group, an amino group, or a substituted amino group, an isocyanate group or an epoxy group is preferable as a substituent. In a case where the functional group is an epoxy group, an amino group, a carboxyl group, or an aziridinyl group is preferable as a substituent.

In addition, the unsaturated group-containing compound (a2) includes 1 to 5 and preferably 1 to 2 energy-ray polymerizable carbon-carbon double bonds in a molecule. Specific examples of the unsaturated group-containing compound (a2) include 2-methacryloyloxyethyl isocyanate, meta-isopropenyl-α,α-dimethylbenzyl isocyanate, methacryloyl isocyanate, allyl isocyanate, 1,1-(bisacryloyloxymethyl)ethyl isocyanate; an acryloyl monoisocyanate compound obtained by reacting a diisocyanate compound or a polyisocyanate compound with a hydroxyethyl (meth)acrylate; an acryloyl monoisocyanate compound obtained by reacting a diisocyanate compound or a polyisocyanate compound, a polyol compound, and hydroxyethyl (meth)acrylate; glycidyl (meth)acrylate; (meth)acrylic acid, 2-(1-aziridinyl)ethyl (meth)acrylate, 2-vinyl-2-oxazoline, and 2-isopropenyl-2-oxazoline.

The unsaturated group-containing compound (a2) is used in a ratio of normally 10 equivalents to 100 equivalents and preferably 20 equivalents to 95 equivalents with respect to 100 equivalents of the functional group-containing monomer of the acrylic copolymer (a1).

In the reaction of the acrylic copolymer (a1) with the unsaturated group-containing compound (a2), the temperature, the pressure, the solvent, the time, the absence or presence of a catalyst, and the kind of the catalyst of the reaction can be appropriately selected according to the combination of a functional group and a substituent. In this manner, the functional group existing in the acrylic copolymer (a1) is reacted with the substituent in the unsaturated group-containing compound (a2) and the unsaturated group is introduced to the side chain of the acrylic copolymer (a1), thereby obtaining an energy-ray curable polymer (A).

The weight average molecular weight of the energy-ray curable polymer (A) obtained in the above-described manner is preferably 10000 or greater, particularly preferably in a range of 150000 to 1500000, and more particularly preferably in a range of 200000 to 1000000. Moreover, the weight average molecular weight (Mw) in the present specification is a value measured by a gel permeation chromatography method (GPC method) in terms of polystyrene.

Even in a case where the energy-ray curable pressure sensitive adhesive includes a polymer having energy-ray curing properties as a main component, the energy-ray curable pressure sensitive adhesive may further contain an energy-ray curable monomer and/or an oligomer (B).

As the energy-ray curable monomer and/or the oligomer (B), for example, an ester or the like of polyhydric alcohol and (meth)acrylic acid can be used.

Examples of such an energy-ray curable monomer and/or an oligomer (B) include monofunctional acrylic acid esters such as cyclohexyl (meth)acrylate and isobornyl (meth) acrylate; polyfunctional acrylic acid esters such as trimethylolpropane tri(meth)acrylate, pentaerythritol tri(meth)acrylate, pentaerythritol tetra(meth)acrylate, dipentaerythritol hexa(meth)acrylate, 1,4-butanediol di(meth)acrylate, 1,6-hexanediol di(meth)acrylate, polyethylene glycol di(meth) acrylate, and dimethylol tricyclodecane di(meth)acrylate; polyester oligo(meth)acrylate; and polyurethane oligo (meth)acrylate.

In a case where the energy-ray curable monomer and/or the oligomer (B) are mixed with each other, the content of the energy-ray curable monomer and/or the oligomer (B) in the energy-ray curable pressure sensitive adhesive is preferably in a range of 5% by mass to 80% by mass and particularly preferably in a range of 20% by mass to 60% by mass.

Here, in a case where ultraviolet rays are used as energy rays in order to cure the energy-ray curable resin composition, it is preferable to add a photopolymerization initiator (C). When the photopolymerization initiator (C) is used, the time for polymerization curing and the amount of light irradiation can be reduced.

Specific examples of the photopolymerization initiator (C) include benzophenone, acetophenone, benzoin, benzoin methyl ether, benzoin ethyl ether, benzoin isopropyl ether, benzoin isobutyl ether, benzoin benzoic acid, methyl benzoin benzoic acid, benzoin dimethyl ketal, 2,4-diethylthioxanthone, 1-hydroxycyclohexylphenylketone, benzyldiphenylsulfide, tetramethylthiuram monosulfide, azobisisobutyronitrile, benzyl, dibenzyl, diacetyl, β-chloroanthraquinone, (2,4,6-trimethylbenzyldiphenyl)phosphineoxide, 2-benzothiazole-N,N-diethyldithiocarbamate, oligo{2-hydroxy-2-methyl-1-[4-(1-propenyl)phenyl]propanone}, and 2,2-dimethoxy-1,2-diphenylethan-1-one. These may be used alone or in combination of two or more kinds thereof.

The content of the photopolymerization initiator (C) is preferably in a range of 0.1 parts by mass to 10 parts by mass and particularly preferably in a range of 0.5 parts by mass to 6 parts by mass with respect to 100 parts by mass of the energy-ray curable copolymer (A) (100 parts by mass which is the total amount of the energy-ray curable copolymer (A), and the energy ray curable monomer and/or the oligomer (B) in a case where the energy-ray curable monomer and/or the oligomer (B) are mixed with each other).

Other suitable components may be mixed with the energy-ray curable pressure sensitive adhesive other than the above-described components. Examples of other components include polymer components or oligomer components (D) which do not have energy-ray curing properties, and cross-linking agents (E).

Examples of the polymer components or oligomer components (D) which do not have energy-ray curing properties include polyacrylic acid ester, polyester, polyurethane, polycarbonate, and polyolefin. Among these, a polymer or an oligomer having a weight average molecular weight (Mw) of 3000 to 2500000 is preferable.

A polyfunctional compound having reactivity with a functional group included in the energy-ray curing copolymer (A) can be used as the crosslinking agent (E). Examples of the polyfunctional compound include an isocyanate compound, an epoxy compound, an amine compound, a melamine compound, an aziridine compound, a hydrazine compound, an aldehyde compound, an oxazoline compound, a metal alkoxide compound, a metal chelate compound, a metal salt, an aluminum salt, and a reactive phenolic resin.

When other components (D) and (E) are mixed with the energy-ray curable pressure sensitive adhesive, tackiness and release properties before curing, strength after curing, adhesiveness to another layer, and storage stability can be improved. The mixed amount of these other components is not particularly limited, and is appropriately determined in a range of 0 parts by mass to 40 parts by mass with respect to 100 parts by mass of the energy-ray curable copolymer (A).

Next, a case where the energy-ray curable pressure sensitive adhesive includes a mixture of a polymer component which does not have energy-ray curing properties, an energy-ray curable polyfunctional monomer and/or oligomer as a main component will be described below.

As the polymer component which does not have energy-ray cuing properties, for example, a component similar to the above-described acrylic copolymer (a1) can be used. The content of the polymer component which does not have energy-ray curing properties in an energy-ray curable resin composition is preferably in a range of 20% by mass to 99.9% by mass and particularly preferably in a range of 30% by mass to 80% by mass.

A component similar to the above-described component (B) is selected as the energy-ray curable polyfunctional monomer and/or the oligomer. In the mixing ratio of the energy-ray curable polyfunctional monomer and/or the oligomer to the polymer component which does not have energy-ray curing properties, the polyfunctional monomer and/or the oligomer is preferably in a range of 10 parts by mass to 150 parts by mass and particularly preferably in a range of 25 parts by mass to 100 parts by mass with respect to 100 parts by mass of the polymer component which does not have energy-ray curing properties.

Even in this case, the photopolymerization initiator (C) or the crosslinking agent (E) can be appropriately mixed in the same manner described above.

The thickness of the adhesive layer 42 is not particularly limited as long as the pressure sensitive adhesive layer 42 can properly function in each process of using the composite sheet 3 for forming a protective film. Specifically, the thickness thereof is preferably in a range of 1 μm to 50 μm, particularly preferably in a range of 2 μm to 30 μm, and more particularly preferably in a range of 3 μm to 20 μm.

As the pressure sensitive adhesive constituting the pressure sensitive adhesive layer 5 for a jig, an adhesive having desired adhesive force and removability is preferable and preferred examples thereof include an acrylic pressure sensitive adhesive, a rubber pressure sensitive adhesive, a silicone pressure sensitive adhesive, a urethane pressure sensitive adhesive, a polyester pressure sensitive adhesive, and a polyvinyl ether pressure sensitive adhesive. Among these, an acrylic pressure sensitive adhesive which has high adhesiveness to a jig of a ring frame or the like, and is capable of effectively suppressing separation of the composite sheet 3 for forming a protective film from the ring frame or the like during the dicing process or the like. In addition, a base material may be present as a core material in the middle of the pressure sensitive adhesive layer 5 for a jig in the thickness direction.

Meanwhile, the thickness of the pressure sensitive adhesive layer 5 for a jig is preferably in a range of 5 μm to 200 μm, and particularly preferably in a range of 10 μm to 100 μm from a viewpoint of adhesiveness to the jig of the ring frame or the like.

2. Method of Producing Composite Sheet for Forming Protective Film

Preferably, the composite sheet 3 for forming a protective film can be produced by separately preparing a first laminate including the protective film-forming film 1 and a second laminate including the adhesive sheet 4 and then laminating the protective film-forming film 1 with the adhesive sheet 4 using the first laminate and the second laminate, but the production method is not limited thereto.

The protective film-forming film 1 is formed on the release surface of a first release sheet in order to produce the first laminate. Specifically, the protective film-forming film 1 is formed by preparing a curable adhesive constituting the protective film-forming film 1 and a coating agent for a protective film-forming film, which further contains a solvent if desired, coating the release surface of the first release sheet with the curable adhesive and the coating agent using a coating machine such as a roll coater, a knife coater, a roll knife coater, an air knife coater, a die coater, a bar coater, a gravure coater, or a curtain coater and then drying the release surface. Next, the release surface of the second release sheet is laminated with the exposed surface of the protective film-forming film 1 to be pressure-bonded to each other, and a laminate (first laminate) formed by interposing the protective film-forming film 1 between two release sheets is obtained.

In the first laminate, the protective film-forming film 1 (and the second release sheet) may be half-cut, if desired, so as to have a desired shape, for example, a circular shape or the like. In this case, extra portions of the protective film-forming film 1 and the second release sheet which are generated due to the half-cut may be appropriately removed.

Moreover, in order to produce the second laminate, the pressure sensitive adhesive layer 42 is formed by coating the release surface of a third release sheet with a coating agent for a pressure sensitive adhesive layer which contains a pressure sensitive adhesive constituting the pressure sensitive adhesive layer 42, and further contains a solvent if desired, and drying the release surface. Thereafter, the base material 41 is pressure-bonded to the exposed surface of the pressure sensitive adhesive layer 42 and then a laminate (second laminate) which includes the adhesive sheet 4 formed of the base material 41 and the pressure sensitive adhesive layer 42; and the third release sheet is obtained.

Here, in a case where the pressure sensitive adhesive layer 42 is formed of the energy-ray curable pressure sensitive adhesive, the pressure sensitive adhesive layer 42 is irradiated with energy rays at this stage and the pressure sensitive adhesive layer 42 may be cured or the pressure sensitive adhesive layer 42 may be cured after being laminated with the protective film-forming film 1. In addition, in a case where the pressure sensitive adhesive layer 42 is cured after being laminated with the protective film-forming film 1, the pressure sensitive adhesive layer 42 may be cured before the dicing process or the pressure sensitive adhesive layer 42 may be cured after the dicing process.

As the energy rays, ultraviolet rays or electron beams are normally used. The irradiation amount of the energy rays varies depending on the kind of the energy ray. For example, in a case of ultraviolet rays, the irradiation amount thereof is preferably in a range of 50 $mJ/cm^2$ to 1000 $mJ/cm^2$ and particularly preferably in a range of 100 $mJ/cm^2$ to 500 $mJ/cm^2$ in terms of the light intensity. Further, in a case of electron beams, the irradiation amount thereof is preferably in a range of approximately 10 krad to 1000 krad.

When the first laminate and the second laminate are obtained in the above-described manner, the second release sheet is release from the first laminate and the third release sheet is release from the second laminate, and the protective film-forming film 1 exposed in the first laminate overlaps the pressure sensitive adhesive layer 42 of the adhesive sheet 4 exposed in the second laminate to be pressure-bonded to each other. The adhesive sheet 4 is half-cut, if desired, so as to have a desired shape, for example, a circular shape having a diameter larger than that of the protective film-forming film 1. In this case, an extra portion of the adhesive sheet 4 which is generated due to the half-cut may be appropriately removed.

In this manner, the composite sheet 3 for forming a protective film which includes the adhesive sheet 4 obtained by laminating the pressure sensitive adhesive layer 42 on the base material 41, the protective film-forming film 1 laminated on the pressure sensitive adhesive layer 42 side of the adhesive sheet 4, and the first release sheet laminated on the opposite side of the adhesive sheet 4 in the protective film-forming film 1 is obtained. Finally, after the first release sheet is released therefrom, the pressure sensitive adhesive layer 5 for a jig is formed on the peripheral edge on the opposite side of the adhesive sheet 4 in the protective film-forming film 1. The pressure sensitive adhesive layer 5 for a jig can be applied and formed in the same method as that of the pressure sensitive adhesive layer 42.

3. Method of Using Composite Sheet for Forming Protective Film

For example, a method of producing a chip provided with a protective film from a semiconductor wafer serving as a workpiece using the composite sheet 3 for forming a protective film according to the present embodiment will be described below.

Figure 4:
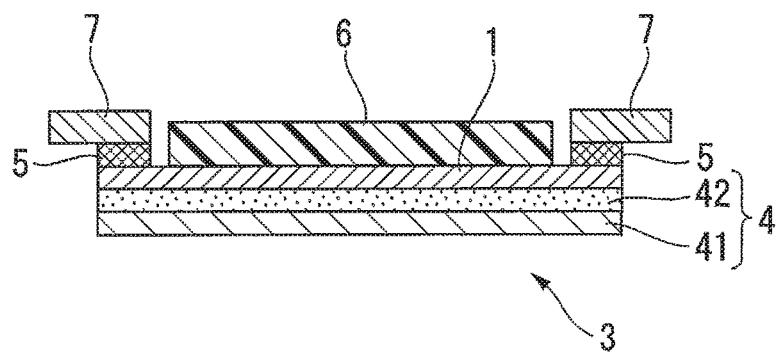
FIG. 4 is a sectional view illustrating a usage example of a composite sheet for forming a protective film according to an embodiment of the present invention.

As illustrated in FIG. 4, the protective film-forming film 1 is adhered to a semiconductor wafer 6 and the pressure sensitive adhesive layer 5 for a jig is adhered to a ring frame 7. When the protective film-forming film 1 is adhered to the semiconductor wafer 6, the protective film-forming film 1 is heated, if desired, and tackiness may be exhibited.

Next, a protective film is formed by curing the protective film-forming film 1, thereby obtaining the semiconductor wafer 6 provided with a protective film. In a case where the protective film-forming film 1 is a thermally curing adhesive, the protective film-forming film 1 may be heated at a predetermined temperature for an appropriate amount of time. In addition, the protective film-forming film 1 may be cured after the dicing process.

When the semiconductor wafer 6 provided with a protective film is obtained in the above-described manner, the protective film is irradiated with laser light through the adhesive sheet 4, if desired, and then laser printing is performed. Further, the laser printing may be performed before the protective film-forming film 1 is cured.

Next, a chip (chip provided with a protective film) including a protective film is obtained by dicing the semiconductor wafer 6 provided with a protective film according to a conventional method. Thereafter, the adhesive sheet 4 is expanded in the plane direction, if desired, and the chip provided with a protective film is picked up from the adhesive sheet 4.

The appearance of the chip provided with a protective film obtained in the above-described manner is excellent because grinding marks caused by the back-grinding process are concealed by the protective film and cannot be seen by visual observation. In addition, since infrared inspection can be performed on the chip provided with a protective film and the semiconductor wafer provided with a protective film through the protective film, cracks or the like can be detected through the infrared inspection and the product yield can be improved.

4. Another Embodiment of Composite Sheet for Forming Protective Film

Figure 3:
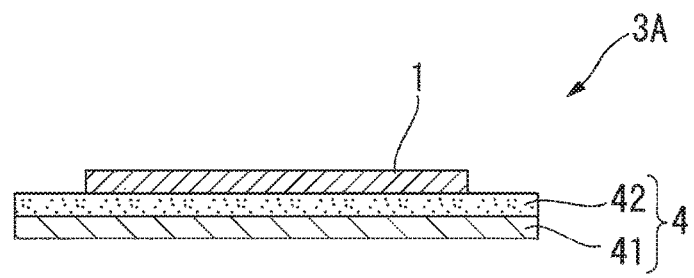
FIG. 3 is a sectional view illustrating a composite sheet for forming a protective film according to another embodiment of the present invention.

FIG. 3 is a sectional view illustrating a composite sheet for forming a protective film according to another embodiment of the present invention. As illustrated in FIG. 3, a composite sheet 3A for forming a protective film according to the present embodiment includes the adhesive sheet 4 formed by laminating the pressure sensitive adhesive layer 42 on one surface of the base material 41 and the protective film-forming film 1 which is laminated on the pressure sensitive adhesive layer 42 side of the adhesive sheet 4. The protective film-forming film 1 in the embodiment is formed so as to be almost similar to a workpiece in the plane direction or slightly larger than the workpiece, and is also formed so as to be smaller than the adhesive sheet 4 in the plane direction. The pressure sensitive adhesive layer 42, in a portion which is not laminated with the protective film-forming film 1, can be adhered to a jig such as a ring frame or the like.

The materials, the thickness, and the like of respective members of the composite sheet 3A for forming a protective film according to the present embodiment are the same as those of respective members of the above-described composite sheet 3 for forming a protective film. However, in a case where the pressure sensitive adhesive layer 42 is formed of an energy-ray curable pressure sensitive adhesive, it is preferable that a portion in a contact with the protective film-forming film 1 in the pressure sensitive adhesive layer 42 allows the energy-ray curable pressure sensitive adhesive to be cured and other portions do not allow the energy-ray curable pressure sensitive adhesive to be cured. In this manner, the smoothness (gloss) of the protective film formed by curing the protective film-forming film 1 can be increased and the adhesiveness to a jig of a ring frame or the like can be maintained to be high.

Moreover, a pressure sensitive adhesive layer for a jig similar to the pressure sensitive adhesive layer 5 for a jig of the above-described composite sheet 3 for forming a protective film may be separately provided in the peripheral edge on the opposite side of the base material 41 in the pressure sensitive adhesive layer 42 of the adhesive sheet 4 of the composite sheet 3A for forming a protective film.

The embodiments described above are described not to limit the present invention but to facilitate the understanding of the present invention. Accordingly, respective elements disclosed in the above-described embodiment are intended to include all design modifications or equivalents belonging to the technical scope of the present invention.

For example, a release sheet may be laminated on the opposite side of the adhesive sheet 4 in the protective film-forming film 1 of the composite sheets 3 and 3A for forming a protective film.

EXAMPLES

Hereinafter, the present invention will be described in detail with reference to examples, but the scope of the present invention is not limited to these examples.

Example 1

The following respective components were mixed with each other at a blending ratios (in terms of the solid content) listed in Table 1 and diluted in methyl ethyl ketone such that the solid content concentration became 61% by mass, thereby preparing a coating agent for a protective film-forming film.

(a) Binder polymer: (meth)acrylic acid ester copolymer (weight average molecular weight: 800000, glass transition temperature: −1° C.) obtained by copolymerizing 10 parts by mass of n-butyl acrylate, 70 parts by mass of methyl acrylate, 5 parts by mass of glycidyl methacrylate, and 15 parts by mass of 2-hydroxy ethyl acrylate (b-1) Bisphenol A type epoxy resin (jER828, manufactured by Mitsubishi Chemical Corporation, epoxy equivalent: 184 g/eq to 194 g/eq)

(b-2) Bisphenol A type epoxy resin (jER1055, manufactured by Mitsubishi Chemical Corporation, epoxy equivalent: 800 g/eq to 900 g/eq)

(b-3) Dicyclopentadiene type epoxy resin (EPICLON HP-7200HH, manufactured by DIC Corporation, epoxy equivalent: 255 g/eq to 260 g/eq)

(c) Thermally active latent epoxy resin curing agent: dicyan diamide (Adeka Hardener EH-3636AS, manufactured by ADEKA Corporation, active hydrogen amount: 21 g/eq)

(d) Curing accelerator: 2-phenyl-4,5-dihydroxymethyl-imidazole (Curezol 2PHZ, manufactured by SHIKOKU CHEMICALS CORPORATION)

(e-1) Silica filler (SC2050MA, manufactured by ADMATECHS CO., LTD., average particle diameter: 0.5 μm)

(e-2) Silica filler (UF310, manufactured by Tokuyama Corporation, average particle diameter: 3 μm)

(e-3) Silica filler (SV-10, manufactured by Tatsumori Ltd., average particle diameter: 8 μm)

(f) Colorant: carbon black (#MA650, manufactured by Mitsubishi Chemical Corporation, average particle diameter: 28 nm)

(g) Silane coupling agent (A-1110, manufactured by UNICA Corporation)

A first release sheet (SP-PET 3811, manufactured by LINTEC Corporation, thickness: 38 μm) obtained by forming a silicone-based release agent layer on one surface of a polyethylene terephthalate (PET) film and a second release sheet (SP-PET 381031, manufactured by LINTEC Corporation, thickness: 38 μm) obtained by forming a silicone-based release agent layer on one surface of a PET film were prepared.

The release surface of the first release sheet was coated with the above-described coating agent for a protective film-forming film such that the thickness of the protective film-forming film to be finally obtained was 25 μm using a knife coater, the release surface thereof was dried in an oven at a temperature of 120° C. for 2 minutes, and a protective film-forming film was formed. Next, the release surface of the second release sheet was overlapped with the protective film-forming film so as to be bonded to each other, and then a sheet for forming a protective film formed of the first release sheet (the release sheet 21 in FIG. 1), the protective film-forming film (the protective film-forming film 1 in FIG. 1) (thickness: 25 μm), and the second release sheet was obtained.

Examples 2 to 4 and Comparative Examples 1 to 4

Sheets for forming a protective film were produced in the same manner as in Example 1 except that the kinds and the mixing amounts of respective components constituting the protective film-forming film were changed as listed in Table 1.

[Test Example 1] <Measurement of Light Transmittance>

The second release sheet was released from the sheet for forming a protective film obtained in Examples and Comparative Examples and heated in an oven at 130° C. for 2 hours in an air atmosphere, and the protective film-forming film was thermally cured to obtain a protective film. Subsequently, the first release sheet was released.

The transmittance of the above-described protective film was measured using a spectrophotometer (UV-VIS-NIR SPECTROPHOTOMETER UV-3600, manufactured by SHIMADZU Corporation) and the light transmittance (%) at a wavelength of 550 nm (visible light beams) or at a wavelength of 1600 nm (infrared rays) was extracted. An attached large sample chamber MPC-3100 was used for measurement and the measurement was carried out without using a built-in integrating sphere. The results are listed in Table 1.

[Test Example 2] <Evaluation of Concealing Properties of Grinding Marks>

The second release sheet was released from the sheet for forming a protective film obtained in Examples and Comparative Examples and then the film for forming a protective film was exposed. The film for forming a protective film was adhered to a polished surface of a silicon wafer polished 2000 times (diameter: 200 mm, thickness: 350 μm) using a tape mounter (Adwill RAD-3600 F/12, manufactured by LINTEC Corporation) while the film was heated at 70° C. and then a first release sheet was released. Next, the film for forming a protective film was cured by being heated at 130° C. for 2 hours to obtain a protective film, thereby obtaining a silicon wafer provided with a protective film.

It was confirmed whether grinding marks on the polished surface of the silicon wafer were able to be detected through a protective film by performing visual observation on obtained 10 sheets of silicon wafers provided with a protective film. A case where grinding marks in the entire silicon wafer provided with a protective film were not able to be seen was evaluated that the grinding mark concealing properties were excellent (A) and a case where grinding marks were able to be seen from even only one sheet was evaluated that the grinding mark concealing properties were poor (B). The results are listed in Table 1.

[Test Example 3] <Infrared Inspection Suitability Evaluation>

A dicing tape (Adwill D-175, manufactured by LINTEC Corporation) was adhered to the protective film surface side of the silicon wafer provided with a protective film obtained in Test Example 2. Further, a silicon chip provided with a protective film was obtained by dicing the silicon wafer provided with a protective film in a dimension of 3 mm×3 mm and picking up the silicon wafer. The protective film side of the obtained silicon chip provided with a protective film was observed using an infrared microscope (BX-IR, manufactured by OLYMPUS CORPORATION), confirmation was made whether grinding marks and chipping of the silicon chip were able to be observed through a protective film, and infrared ray inspection suitability was evaluated based on the following criteria. The results are listed in Table 1.

A: Grinding marks were clearly observed. In addition, chipping having a size in which the distance from the chip side surface was in a range of 5 μm to less than 10 μm was clearly observed.

B: Grinding marks were clearly observed. In addition, chipping having a size in which the distance from the chip side surface was 10 μm or greater was clearly observed, but chipping having a size in which the distance from the chip side surface was in a range of 5 μm to less than 10 μm was not clear.

C: Grinding marks were observed to some extent. In addition, chipping having a size in which the distance from the chip side surface was in a range of 5 μm to less than 10 μm was not observed, and chipping having a size in which the distance from the chip side surface was 10 μm or greater was not clear.

D: Grinding marks were not observed, and chipping was not observed regardless of the size thereof

TABLE 1

|  |  | Example 1 | Example 2 | Example 3 | Example 4 | Comparative Example 1 | Comparative Example 2 | Comparative Example 3 | Comparative Example 4 |
|---|---|---|---|---|---|---|---|---|---|
| Film components for forming protective film (parts by mass) | a | 150 | 150 | 150 | 150 | 150 | 150 | 150 | 150 |
|  | b-1 | 60 | 60 | 60 | 60 | 60 | 60 | 60 | 60 |
|  | b-2 | 10 | 10 | 10 | 10 | 10 | 10 | 10 | 10 |
|  | b-3 | 30 | 30 | 30 | 30 | 30 | 30 | 30 | 30 |
|  | c | 2 | 2 | 2 | 2 | 2 | 2 | 2 | 2 |
|  | d | 2 | 2 | 2 | 2 | 2 | 2 | 2 | 2 |
|  | e-1 | 320 | 320 | 320 | 320 | 320 | 320 | — | — |
|  | e-2 | — | — | — | — | — | — | 320 | — |
|  | e-3 | — | — | — | — | — | — | — | 320 |
|  | f | 0.6 | 1.2 | 1.7 | 2.3 | 5.8 | 0.0 | 1.2 | 1.2 |
|  | g | 2 | 2 | 2 | 2 | 2 | 2 | 2 | 2 |
|  | Total | 577 | 578 | 579 | 579 | 583 | 577 | 577 | 577 |
| Content of filler (% by mass) |  | 55 | 55 | 55 | 55 | 55 | 55 | 55 | 55 |
| Content of carbon black (% by mass) |  | 0.1 | 0.2 | 0.3 | 0.4 | 1.0 | 0.0 | 0.2 | 0.2 |
| Visible light transmittance (%) |  | 10 | 6 | 3 | 2 | 1 | 21 | 9 | 8 |
| Infrared transmittance (%) |  | 65 | 53 | 46 | 41 | 13 | 74 | 23 | 21 |
| Grinding mark concealing properties |  | A | A | A | A | A | B | A | A |
| Infrared inspection suitability |  | A | A | B | B | D | A | D | D |

As understood from Table 1, the protective film-forming film of Examples whose light transmittance at a wavelength of 550 nm was 20% or less and light transmittance at a wavelength of 1600 nm was 25% or greater had excellent grinding mark concealing properties and infrared inspection suitability.

INDUSTRIAL APPLICABILITY

The protective film-forming film and the (composite) sheet for forming a protective film according to the present invention is preferably used to produce a chip having a protective film from a semiconductor wafer. Further, the inspection method according to the present invention is suitable for performing inspection on cracks or the like in a chip having a protective film.

REFERENCE SIGNS LIST

1: Protective film-forming film
2: Sheet for forming protective film
21: Release sheet
3, 3A: Composite sheet for forming protective film
4: Adhesive sheet
41: Base material 42: Pressure sensitive adhesive layer
5: Pressure sensitive adhesive layer for jig
6: Semiconductor wafer
7: Ring frame

The invention claimed is:

1. An inspection method comprising:
adhering a protective film-forming film to a semiconductor wafer,
curing the protective film-forming film to obtain a semiconductor wafer provided with a protective film; and
irradiating infrared rays to the semiconductor wafer provided with the protective film or a semiconductor chip obtained by processing the semiconductor wafer provided with the protective film, to inspect presence of cracks which cannot be detected by visual observation in the semiconductor wafer provided with the protective film or the semiconductor chip provided with the protective film;
wherein the light transmittance at a wavelength of 1600 nm of the protective film-forming film is 25% or greater, and
the light transmittance at a wavelength of 550 nm of the protective film-forming film is 20% or less.

2. An inspection method according to claim 1,
wherein the protective film-forming film contains a colorant in a range of 0.05% by mass to 0.75% by mass and a filler having an average particle diameter of 0.01 μm to 2 μm.

3. An inspection method comprising:
laminating a release sheet on one or both surfaces of a protective film-forming film to obtain a sheet for forming a protective film,
adhering the sheet for forming a protective film to a semiconductor wafer,
curing the protective film-forming film to obtain a semiconductor wafer provided with a protective film; and
irradiating infrared rays to the semiconductor wafer provided with the protective film or a semiconductor chip obtained by processing the semiconductor wafer provided with the protective film, to inspect presence of cracks which cannot be detected by visual observation in the semiconductor wafer provided with the protective film or the semiconductor chip provided with the protective film;
wherein the light transmittance at a wavelength of 1600 nm of the protective film-forming film is 25% or greater, and
the light transmittance at a wavelength of 550 nm of the protective film-forming film is 20% or less.

4. An inspection method according to claim 3,
wherein the protective film-forming film contains a colorant in a range of 0.05% by mass to 0.75% by mass and a filler having an average particle diameter of 0.01 μm to 2 μm.

5. An inspection method comprising:
laminating an adhesive sheet on a pressure sensitive adhesive layer on one surface side of a base material,
laminating a protective film-forming film on the pressure sensitive adhesive layer side of the adhesive sheet to obtain a composite sheet for forming a protective film,
adhering the composite sheet for forming a protective film to a semiconductor wafer,
curing the protective film-forming film to obtain a semiconductor wafer provided with a protective film; and
irradiating infrared rays to the semiconductor wafer provided with the protective film or a semiconductor chip obtained by processing the semiconductor wafer provided with the protective film, to inspect presence of cracks which cannot be detected by visual observation in the semiconductor wafer provided with the protective film or the semiconductor chip provided with the protective film;
wherein the light transmittance at a wavelength of 1600 nm of the protective film-forming film is 25% or greater, and
the light transmittance at a wavelength of 550 nm of the protective film-forming film is 20% or less.

6. An inspection method according to claim 5,
wherein the protective film-forming film contains a colorant in a range of 0.05% by mass to 0.75% by mass and a filler having an average particle diameter of 0.01 μm to 2 μm.

* * * * *